US012593534B2

(12) United States Patent
Yamaguchi et al.

(10) Patent No.: US 12,593,534 B2
(45) Date of Patent: Mar. 31, 2026

(54) METHOD OF PRODUCING SEMICONDUCTOR DEVICE

(71) Applicant: NICHIA CORPORATION, Anan (JP)

(72) Inventors: Yoshiki Yamaguchi, Suita (JP); Hiroki Hayashi, Anan (JP); Satoshi Okumura, Anan (JP); Minoru Yamamoto, Anan (JP); Hiroaki Tamemoto, Anan (JP)

(73) Assignee: NICHIA CORPORATION, Anan (JP)

( * ) Notice: Subject to any disclaimer, the term of this patent is extended or adjusted under 35 U.S.C. 154(b) by 402 days.

(21) Appl. No.: 18/310,002

(22) Filed: May 1, 2023

(65) Prior Publication Data

US 2023/0387344 A1     Nov. 30, 2023

(30) Foreign Application Priority Data

May 31, 2022     (JP) ................................. 2022-088883

(51) Int. Cl.
H10H 20/01          (2025.01)
H01L 21/66          (2006.01)
(52) U.S. Cl.
CPC ............. H10H 20/01 (2025.01); H01L 22/10 (2013.01); H01L 22/22 (2013.01); H10H 20/0364 (2025.01)
(58) Field of Classification Search
CPC ......... H01L 22/10; H01L 22/12; H01L 22/20; H01L 22/22; H01L 22/24; H10H 20/01; H10H 20/0364; H10H 20/032
See application file for complete search history.

(56) References Cited

U.S. PATENT DOCUMENTS

2005/0186760 A1     8/2005  Hashimura et al.
2006/0192209 A1*    8/2006  Maeda ................... B82Y 20/00
                                                          257/79

(Continued)

FOREIGN PATENT DOCUMENTS

JP          H0927489 A   *  1/1997
JP          H10-125632 A     5/1998

(Continued)

OTHER PUBLICATIONS

Parent application JP2022-088883 Notice of Allowance. Issued: Jun. 4, 2024 (Year: 2024).*

(Continued)

*Primary Examiner* — Andres Munoz
(74) *Attorney, Agent, or Firm* — Foley & Lardner LLP

(57)          ABSTRACT

A method of producing a semiconductor device, the method includes steps of: detecting a defect included in a semiconductor layer; forming a metal film on the semiconductor layer; after forming the metal film on the semiconductor layer, exposing the semiconductor layer through the metal film by removing a portion of the metal film by irradiation with a first laser emitting red or infrared light; and after the step of exposing the semiconductor layer, removing a portion of the semiconductor layer by irradiation with a second laser emitting ultraviolet light, said portion of the semiconductor layer including the defect. A diameter of said portion of the metal film is greater than a diameter of said portion of the semiconductor layer in a plan view. Said portion of the metal film overlaps with said portion of the semiconductor layer in the plan view.

7 Claims, 17 Drawing Sheets

(56) References Cited

U.S. PATENT DOCUMENTS

| | | | |
|---|---|---|---|
| 2008/0191226 A1 | 8/2008 | Urashima | |
| 2011/0171757 A1* | 7/2011 | Yamamuro | H10F 71/00 |
| | | | 257/E31.11 |
| 2013/0288455 A1 | 10/2013 | Faurie et al. | |
| 2018/0114692 A1 | 4/2018 | Kitamura et al. | |
| 2019/0123238 A1* | 4/2019 | Moosburger | H10H 20/8312 |
| 2020/0043672 A1* | 2/2020 | Mori | H01G 9/2068 |
| 2020/0381367 A1 | 12/2020 | Arita et al. | |
| 2022/0157660 A1* | 5/2022 | Kim | H01L 21/3043 |

FOREIGN PATENT DOCUMENTS

| | | | |
|---|---|---|---|
| JP | H10120496 A | * | 5/1998 |
| JP | 2004-228290 A | | 8/2004 |
| JP | 2006-287208 A | | 10/2006 |
| JP | 2009-038407 A | | 2/2009 |
| JP | 2012-012227 A | | 1/2012 |
| JP | 2013-055300 A | | 3/2013 |
| JP | 2015-516359 A | | 6/2015 |
| JP | 2018-054756 A | | 4/2018 |
| JP | 2018-065730 A | | 4/2018 |
| JP | 2020-194918 A | | 12/2020 |
| WO | WO-2010/032465 A1 | | 3/2010 |

OTHER PUBLICATIONS

Parent application JP2022-088883 Search Report. Issued: May 8, 2024 (Year: 2024).*

Hara et al., JP H0927489 A, machine translation. (Year: 1997).*

Hara et al., JP H10120496 A, machine translation (Year: 1998).*

* cited by examiner

FIG.20

METHOD OF PRODUCING SEMICONDUCTOR DEVICE

CROSS-REFERENCE TO RELATED APPLICATIONS

The present application is based on and claims priority to Japanese patent application No. 2022-088883, filed on May 31, 2022, the entire contents of which are hereby incorporated by reference.

BACKGROUND

The present disclosure relates to methods of producing a semiconductor device.

Manufacturing a semiconductor device as known in the art may involve detecting a defect in a semiconductor layer, forming an electrode on the semiconductor layer, followed by removing the defect in the semiconductor layer by laser irradiation (see Japanese Patent Publication Nos. 2018-54756 and No. 2013-55300, for example).

A process of irradiating the electrode and the semiconductor layer with a laser creates a hole in the electrode and the semiconductor layer. Depending on the kind of metal constituting the electrode, metal migration occurs, which may cause short-circuiting in the semiconductor layer.

It is an object of the present disclosure to provide a method of producing a semiconductor device in which a short-circuit resulting from the migration of a metal constituting an electrode tends not to occur.

SUMMARY

According to one embodiment, a method of producing a semiconductor device incudes detecting a defect included in a semiconductor layer, forming a metal film on the semiconductor layer, removing a first portion of the semiconductor layer by irradiation with a first laser emitting ultraviolet light after the forming of the metal film, the first portion including the defect and having a first diameter in a plan view, and exposing, between the forming of the metal film and the removing of the first portion, the semiconductor layer through the metal film by removing a second portion of the metal film by irradiation with a second laser emitting red or infrared light, the second portion having a second diameter larger than the first diameter in the plan view and overlapping with the first portion in the plan view.

According to at least one embodiment, a method of producing a semiconductor device is provided in which an occurrence of a short-circuit resulting from metal migration can be reduced.

BRIEF DESCRIPTION OF THE DRAWINGS

FIG. 20 is a cross-sectional view illustrating the method of producing a semiconductor device according to the fourth embodiment;

DETAILED DESCRIPTION

Figure 1:
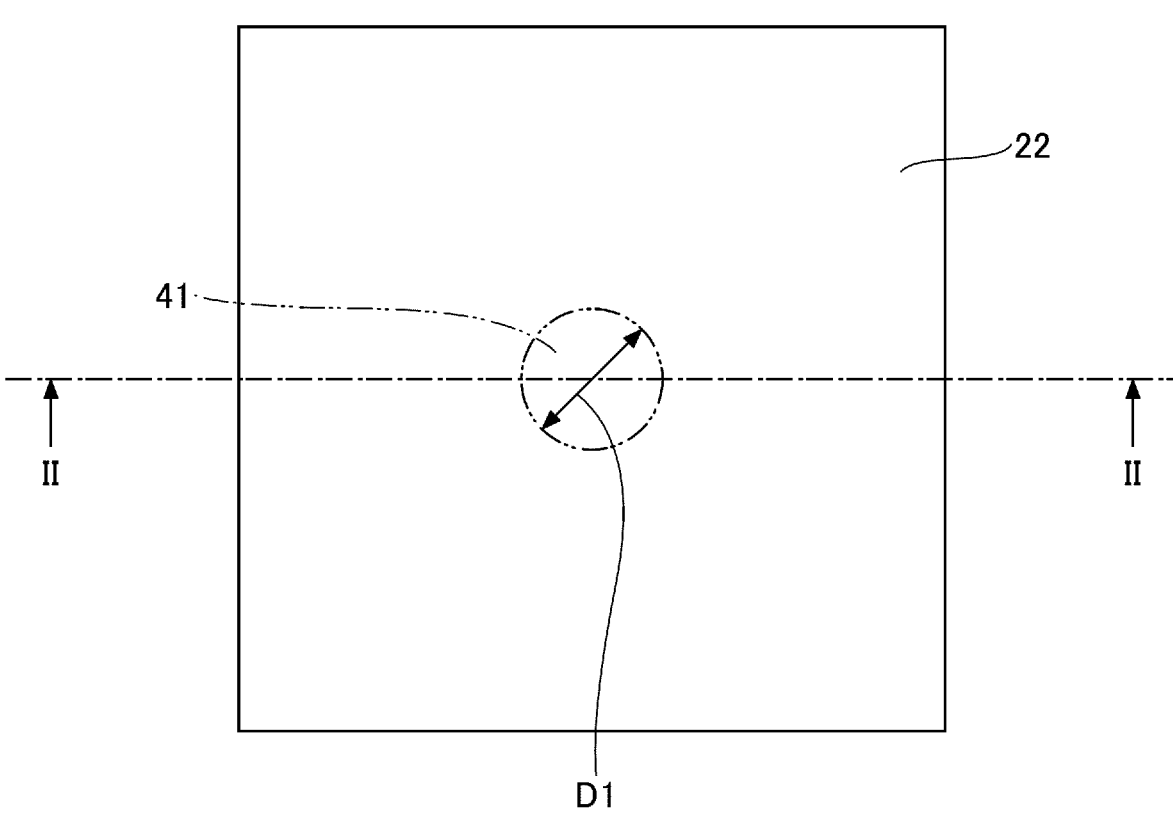
FIG. 1 is a drawing illustrating a method of producing a semiconductor device according to a first embodiment.

In the following, embodiments for carrying out the technology of the present disclosure will be described with reference to the accompanying drawings. The following description is provided only for the purpose of embodying the technical concept of the present disclosure, and the present disclosure is not limited to the following description unless otherwise specified.

In the drawings, members having the same function may be denoted by the same reference numerals. Although sometimes shown in separate embodiments for the sake of convenience in consideration of ease of explanation or ease of understanding of key points, configurations shown in different embodiments or examples may be partially replaced with or combined with one another. A description of an embodiment given after a description of another embodiment will be focused mainly on matters different from those of the already described embodiment, and a duplicate description may be omitted with respect to the matters shared with the already described embodiment. The sizes, positional relationships, and the like of members shown in the drawings may sometimes be exaggerated for clearer illustration. The use of ordinal numbers in the present application is for identification purposes only. Ordinal numbers used in the specification may not match those used in the claims. For example, a portion referred to as a "first portion" in the claims may correspond to a "second portion" in the specification, and vice versa.

First Embodiment

A first embodiment will be explained. The first embodiment relates to a method of producing a semiconductor device. FIGS. 1 through 8 are drawings illustrating the method of producing a semiconductor device according to the first embodiment. FIGS. 1, 3, 5 and 7 are top views, and FIGS. 2, 4, 6 and 8 are cross-sectional views. FIG. 2 corresponds to a cross-sectional view taken along the line II-II in FIG. 1. FIG. 4 corresponds to a cross-sectional view taken along the line IV-IV in FIG. 3. FIG. 6 corresponds to a cross-sectional view taken along the line VI-VI in FIG. 5. FIG. 8 corresponds to a cross-sectional view taken along the line VIII-VIII in FIG. 7.

Figure 2:
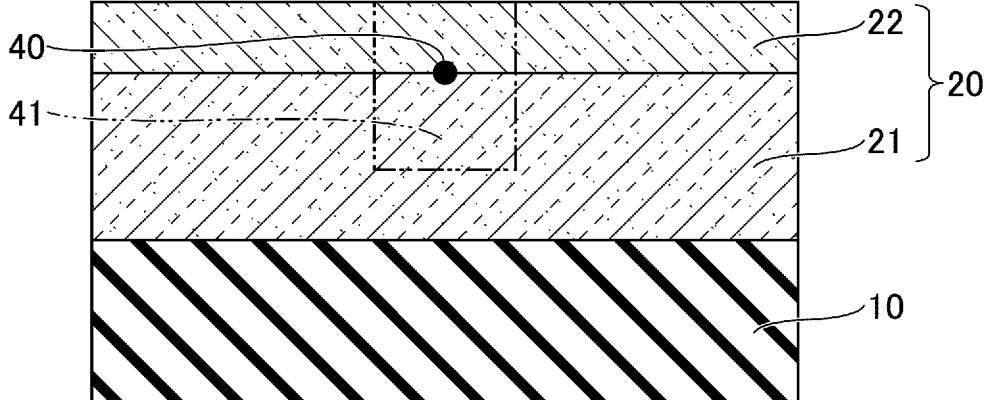
FIG. 2 is a drawing illustrating the method of producing a semiconductor device according to the first embodiment.

In the first embodiment, a step of forming a semiconductor layer 20 on a substrate 10 is first performed as illustrated in FIGS. 1 and 2. The substrate 10 is a sapphire substrate, for example. The step of forming the semiconductor layer 20 includes, for example, a step of forming an n-side semiconductor layer 21 on the substrate 10 and a step of forming the p-side semiconductor layer 22 on the n-side semiconductor layer 21. In the step of forming the semiconductor layer 20, a defect 40 may occur inside the semiconductor layer 20. The defect 40 is a portion where a part of the semiconductor layer 20 is altered or modified. Examples of the defect 40 include dislocation caused by lattice mismatch between the substrate 10 and the semiconductor layer 20. In the present embodiment, the semiconductor layer 20 is inspected after the formation of the semiconductor layer 20 to detect the defect 40. The defect 40 occurs, for example, at the interface between the n-side semiconductor layer 21 and the p-side semiconductor layer 22 or in the vicinity of the interface. The defect 40 may also occur away from the interface. The defect 40 to be removed in the present embodiment is not a defect existing on the surface of the semiconductor layer 20 but a defect existing inside the semiconductor layer 20. The width of the defect 40 to be removed in the present embodiment is, for example, 0.1 μm or more and 20 μm or less in a plan view normal to the upper surface of the semiconductor layer 20. The semiconductor layer 20 is formed of a nitride semiconductor, for example. The n-side semiconductor layer 21 is an n-type GaN layer, for example, and the p-side semiconductor layer 22 is a p-type GaN layer, for example. The thickness of the semiconductor layer 20 is, for example, 1.0 μm or more and 20 μm or less.

The semiconductor layer 20 includes a first portion 41 including the defect 40. The first portion 41 is a portion to be removed by irradiation L1 with a first laser, which will be described later. The first portion 41 is, for example, a circular region having a first diameter D1 in a plan view normal to the upper surface of the semiconductor layer 20. The first diameter D1 is preferably about the same as the beam diameter of the first laser, which will be used later. The first portion 41 has an upper surface that is the same as the surface of the semiconductor layer 20, and has a lower surface closer to the substrate 10 than is the upper surface, with the defect 40 existing between the lower surface and the upper surface. As will be described later, the first laser emits ultraviolet light. The first diameter D1 is, for example, 0.5 μm or more and 20 μm or less. The distance between the upper surface and the lower surface of the first portion 41 is, for example, 0.5 μm or more and 20 μm or less.

Figure 3:
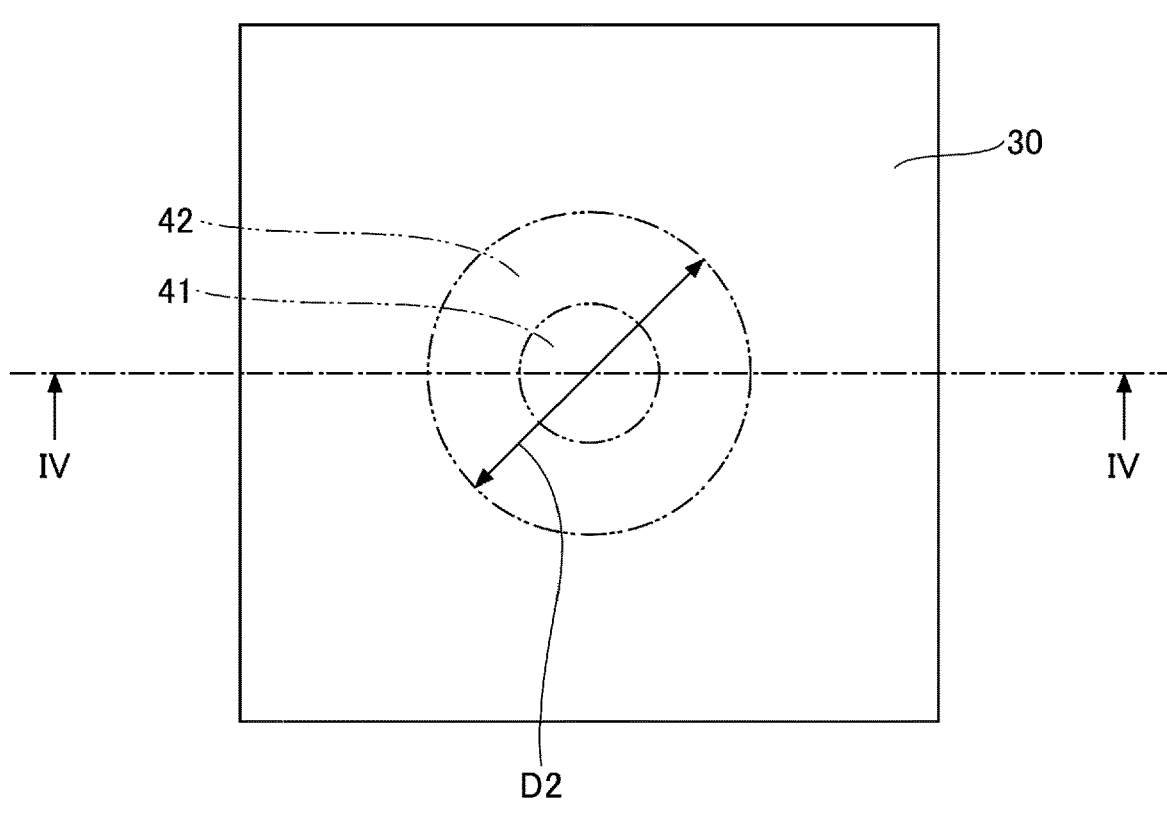
FIG. 3 is a drawing illustrating the method of producing a semiconductor device according to the first embodiment.
Figure 4:
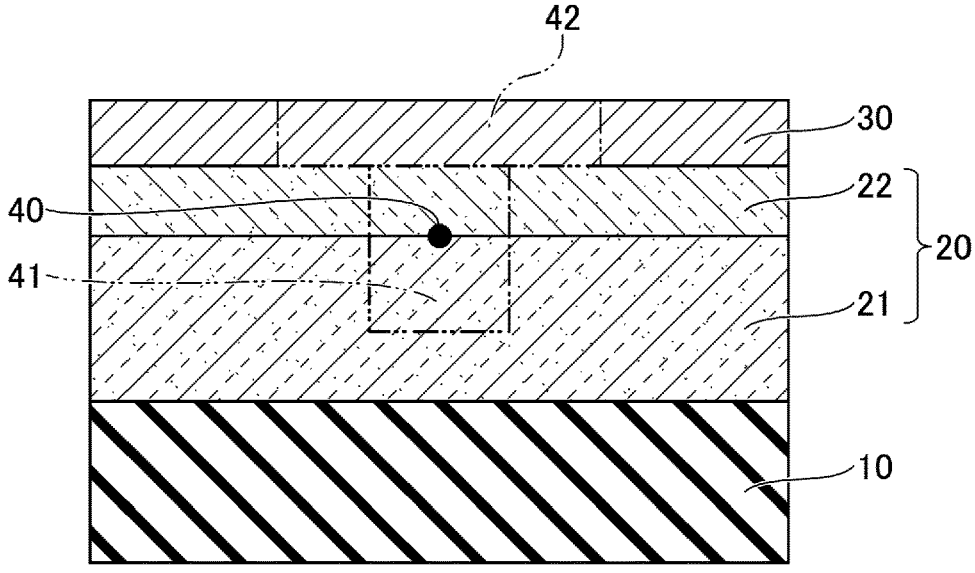
FIG. 4 is a drawing illustrating the method of producing a semiconductor device according to the first embodiment.

As illustrated in FIGS. 3 and 4, a step of forming a metal film 30 on the semiconductor layer 20 is performed. Examples of the material of the metal film 30 include at least one selected from the group consisting of silver (Ag), aluminum (Al), lead (Pb), copper (Cu), tin (Sn), zinc (Zn), and gold (Au). The metal film 30 includes a second portion 42 overlapping the first portion 41 in the plan view. The second portion 42 is a portion to be removed by irradiation with a second laser, which will be described later. The thickness of the second portion 42 is equal to the thickness of the metal film 30. The second portion 42 is, for example, a circular region having a second diameter D2 in the plan view. The second diameter D2 is preferably about the same as the beam diameter of the second laser, which will be used later. The second diameter D2 is larger than the first diameter D1. Preferably, the center of the second portion 42 and the center of the first portion 41 are at the same position in the plan view. As will be described below, the second laser emits red or infrared light. The second diameter D2 is, for example, 1.5 μm or more and 200 μm or less.

Figure 5:
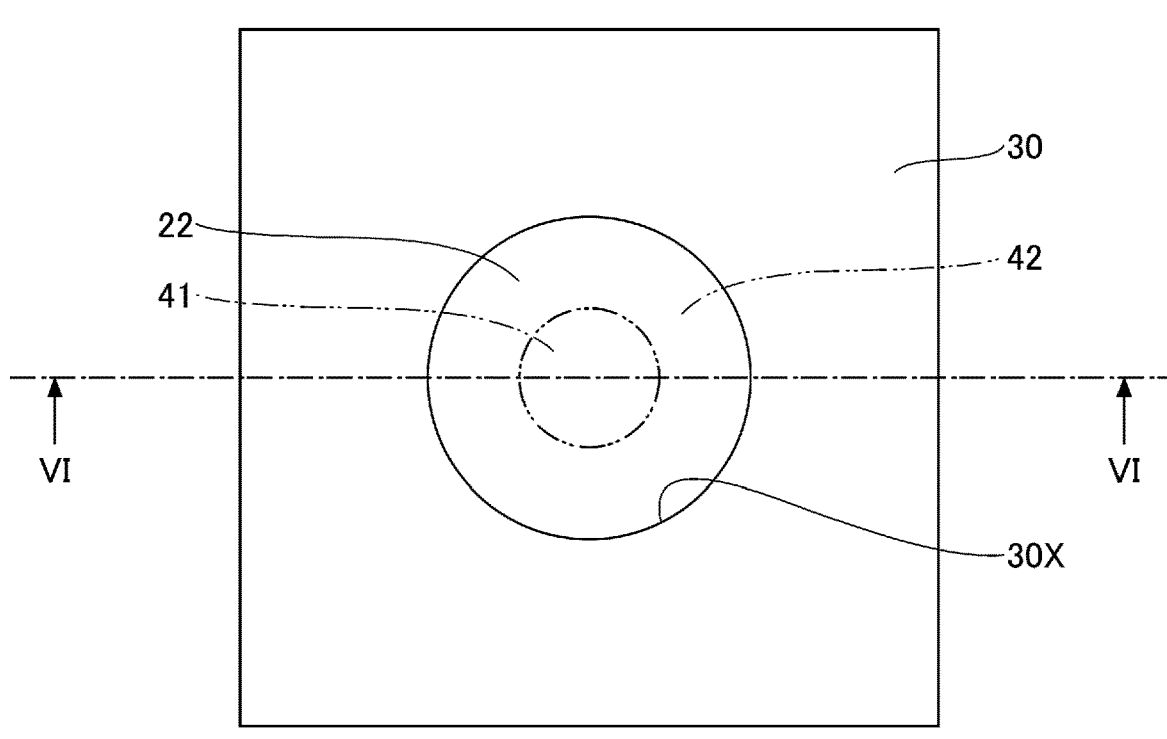
FIG. 5 is a drawing illustrating the method of producing a semiconductor device according to the first embodiment.
Figure 6:
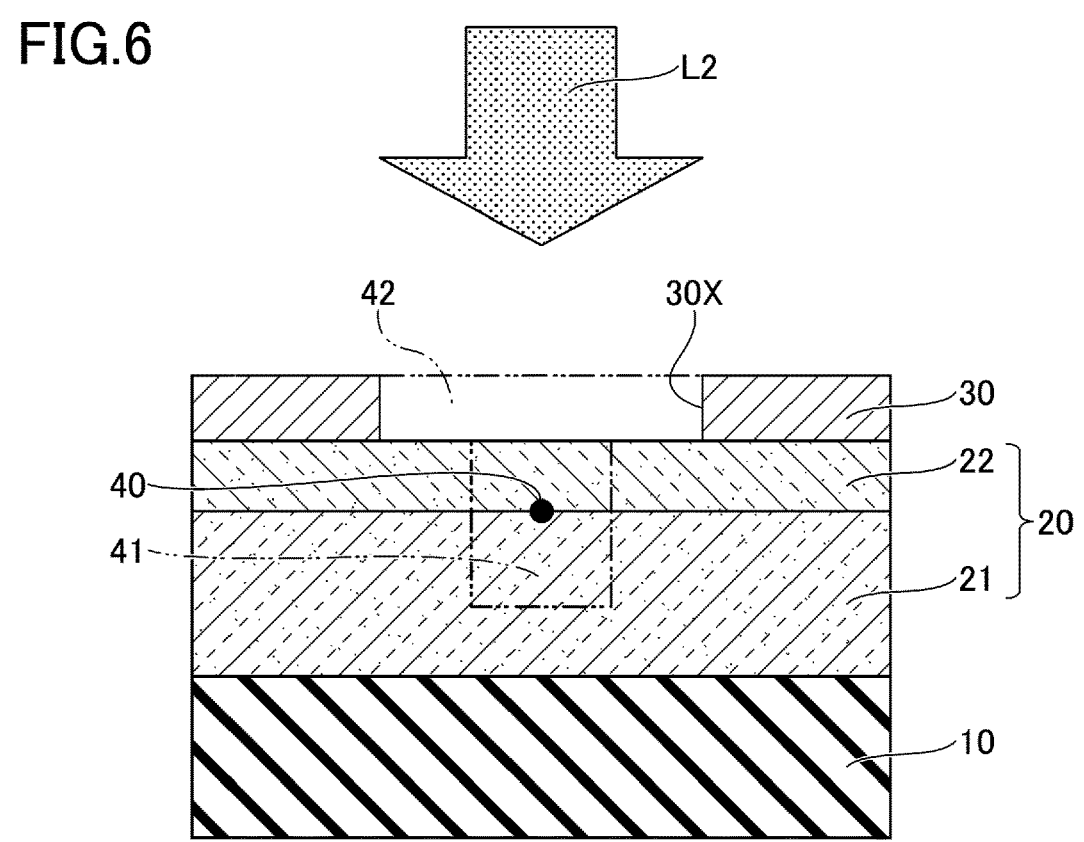
FIG. 6 is a drawing illustrating the method of producing a semiconductor device according to the first embodiment.

As illustrated in FIGS. 5 and 6, the second portion 42 of the metal film 30 is removed by irradiation L2 with the second laser emitting red or infrared light to expose the semiconductor layer 20 through the metal film 30. With the removal of the second portion 42, a hole 30X having the second diameter D2 is formed through the metal film 30. The wavelength of the second laser is, for example, 680 nm or more and 1550 nm or less.

Figure 7:
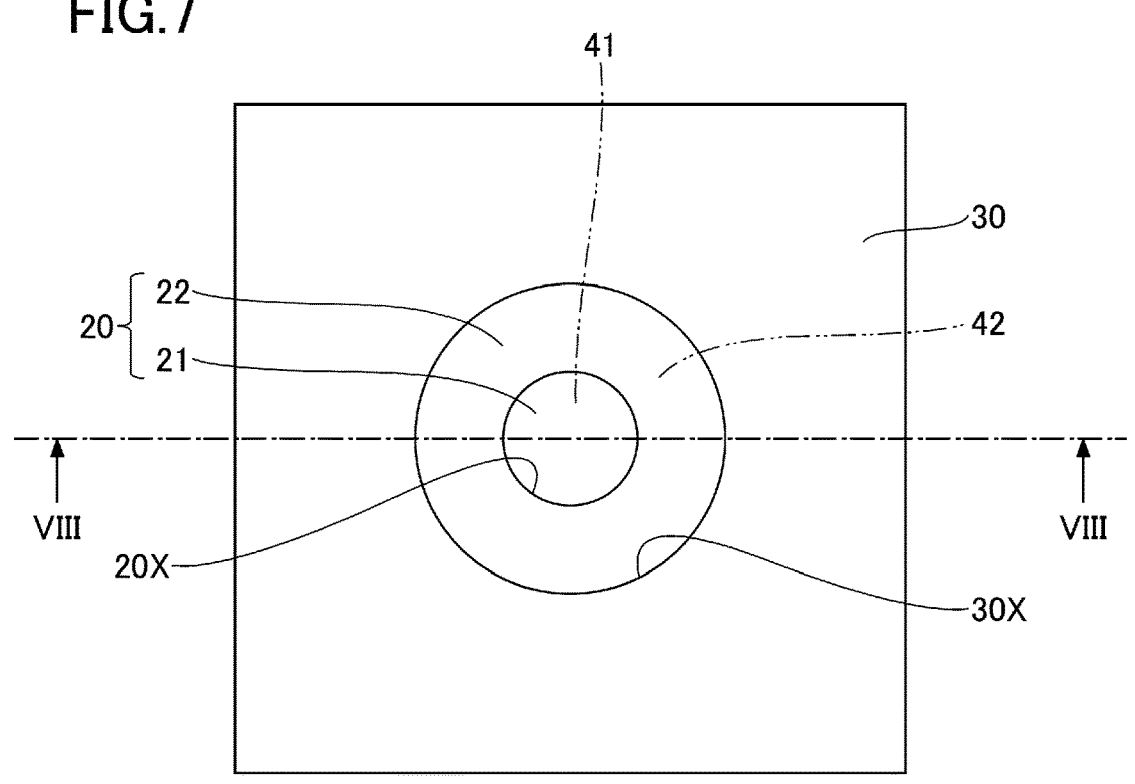
FIG. 7 is a drawing illustrating the method of producing a semiconductor device according to the first embodiment.
Figure 8:
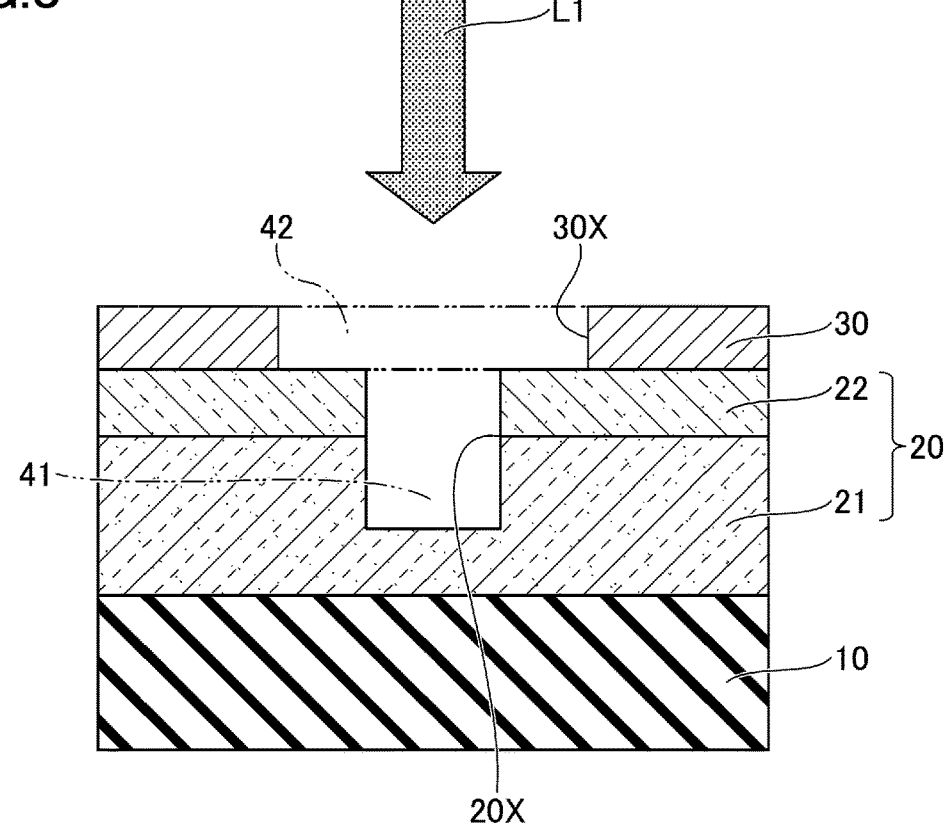
FIG. 8 is a drawing illustrating the method of producing a semiconductor device according to the first embodiment.

As illustrated in FIGS. 7 and 8, a step of removing the first portion 41 by irradiation L1 with the first laser emitting ultraviolet light is performed. With the removal of the first portion 41, the defect 40 included in the first portion 41 is also removed. With the removal of the first portion 41, also, a hole 20X having the first diameter D1 is formed in the semiconductor layer 20. The wavelength of the first laser is, for example, 190 nm or more and 400 nm or less.

An insulating film or the like is subsequently formed on the surface of the semiconductor layer 20 according to need. With this, the semiconductor device is completed in final form.

In the first embodiment, the second diameter D2 of the hole 30X is larger than the first diameter D1 of the hole 20X. Accordingly, a short-circuit is less likely to occur between the n-side semiconductor layer 21 and the p-side semiconductor layer 22 even if migration of metal contained in the metal film 30 occurs after the formation of the hole 30X. For example, this arrangement reduces the likelihood of the metal migrating to the interface between the n-side semiconductor layer 21 and the p-side semiconductor layer 22 along the inner surface of the hole 20X, which can make it less likely for a short-circuit to occur. Further, as noted, the hole 30X is formed by the irradiation L2 with the second laser emitting red or infrared light. By using the second laser that emits red or infrared light, the threshold of the irradiation intensity of the laser light that causes laser ablation in the metal film 30 becomes smaller than the threshold of the irradiation intensity of the laser light that causes laser ablation in the semiconductor layer 20. Accordingly, the metal film 30 can be processed to form the hole 30X while reducing the occurrence of deterioration of the semiconductor layer 20 caused by the laser light.

Second Embodiment

Figure 9:
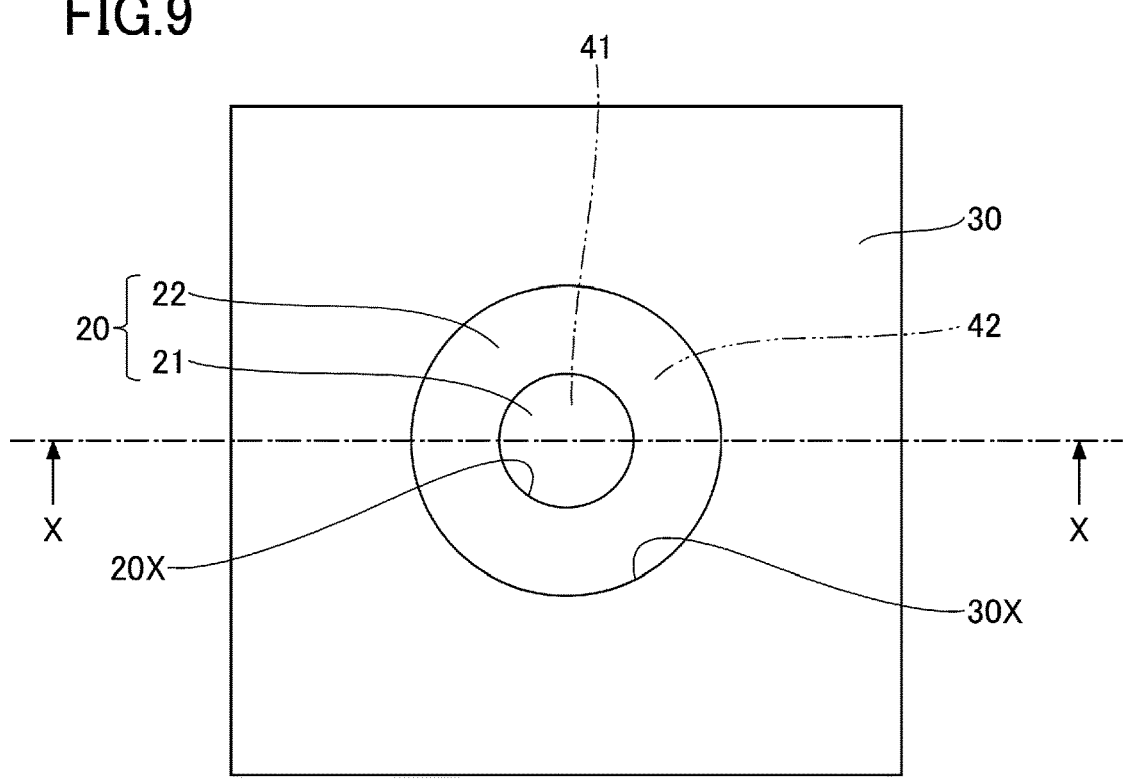
FIG. 9 is a drawing illustrating a method of producing a semiconductor device according to a second embodiment.
Figure 10:
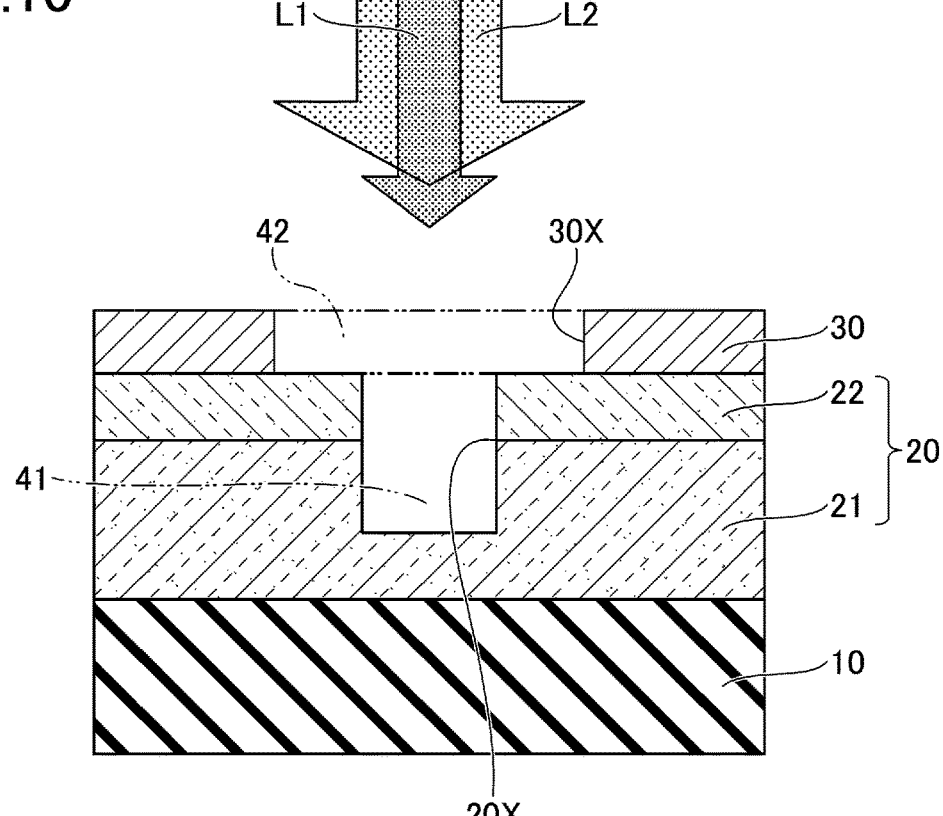
FIG. 10 is a drawing illustrating the method of producing a semiconductor device according to the second embodiment.

A second embodiment will be explained. The second embodiment differs from the first embodiment in the timing of irradiation by the first laser and the timing of irradiation by the second laser. FIG. 9 and FIG. 10 are drawings illustrating a method of producing a semiconductor device according to the second embodiment. FIG. 9 is a top view and FIG. 10 is a cross-sectional view. FIG. 10 corresponds to a cross-sectional view taken along the line X-X in FIG. 9.

In the second embodiment, substantially the same steps as in the first embodiment are performed up to the step of forming the metal film 30 (see FIGS. 1 through 4). In the subsequent step, irradiation L1 with the first laser emitting ultraviolet light and irradiation L2 with the second laser emitting red or infrared light are simultaneously performed. To be more specific, as illustrated in FIGS. 9 and 10, the first portion 41 of the semiconductor layer 20 is removed by irradiation L1 with the first laser emitting ultraviolet light, and the second portion 42 is removed by irradiation L2 with the second laser emitting red or infrared light. With the removal of the first portion 41, the defect 40 included in the first portion 41 is also removed. With the removal of the first portion 41, further, a hole 20X having the first diameter D1 is formed in the semiconductor layer 20. With the removal of the second portion 42, a hole 30X having the second diameter D2 is formed through the metal film 30. As a result, the semiconductor layer 20 is exposed through the metal film 30.

An insulating film or the like is subsequently formed on the surface of the semiconductor layer 20 according to need. With this, the semiconductor device is completed in final form.

In the second embodiment also, the second diameter D2 of the hole 30X is larger than the first diameter D1 of the hole 20X. Accordingly, a short-circuit is less likely to occur between the n-side semiconductor layer 21 and the p-side semiconductor layer 22 even if migration of metal contained in the metal film 30 occurs after the formation of the hole 30X. For example, this arrangement reduces the likelihood of the metal migrating to the interface between the n-side semiconductor layer 21 and the p-side semiconductor layer 22 along the inner surface of the hole 20X, which can make it less likely for a short-circuit to occur. Further, forming the hole 30X by the irradiation L2 with the second laser emitting red or infrared light enables the processing of the metal film 30 to form the hole 30X while reducing the occurrence of deterioration of the semiconductor layer 20 caused by the laser light. In this manner, the second embodiment can bring about the same effects as those of the first embodiment. Further, in the second embodiment, the irradiation L1 by the first laser that emits ultraviolet light and the irradiation L2 by the second laser that emits red or infrared light are performed at the same time, which can enable the shortening of processing time, compared with the first embodiment.

The arrangement of an optical system such as a half mirror may be adjusted to allow the regions including an overlapping area in the plan view to be simultaneously subjected to the irradiation L1 by the first laser emitting ultraviolet light and the irradiation L2 by the second laser emitting red or infrared light.

Third Embodiment

Figure 11:
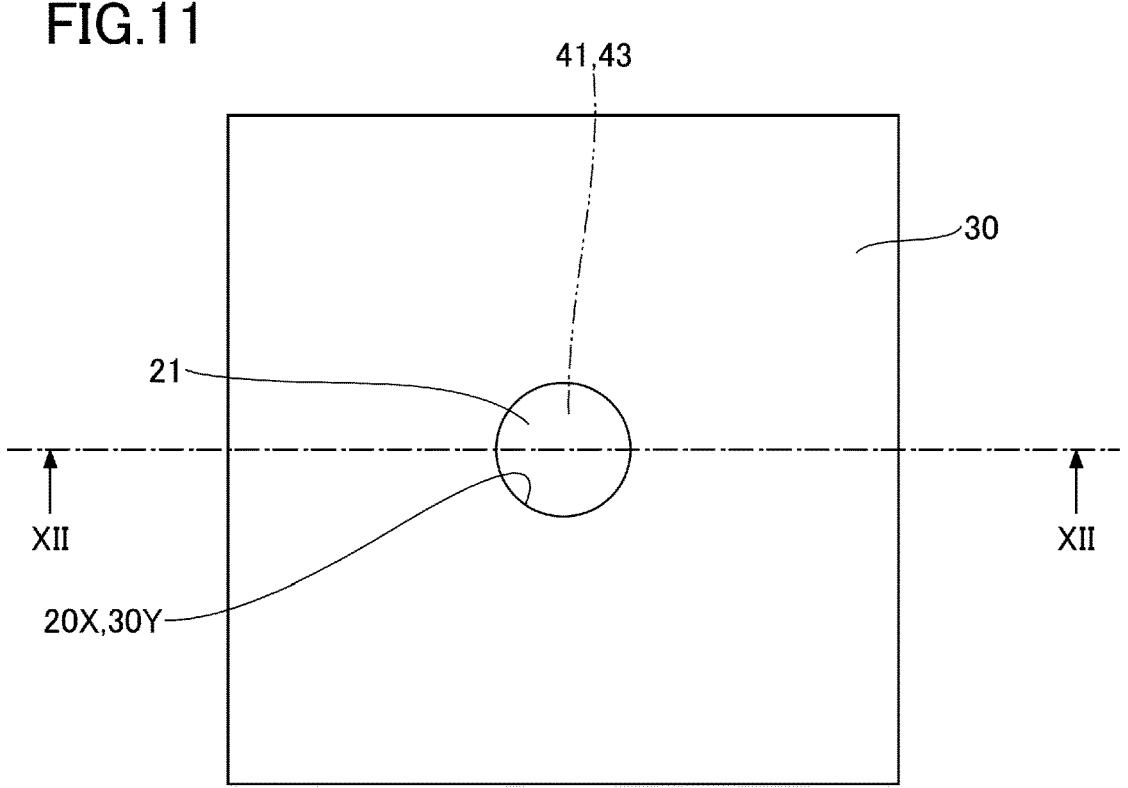
FIG. 11 is a drawing illustrating a method of producing a semiconductor device according to a third embodiment.
Figure 12:
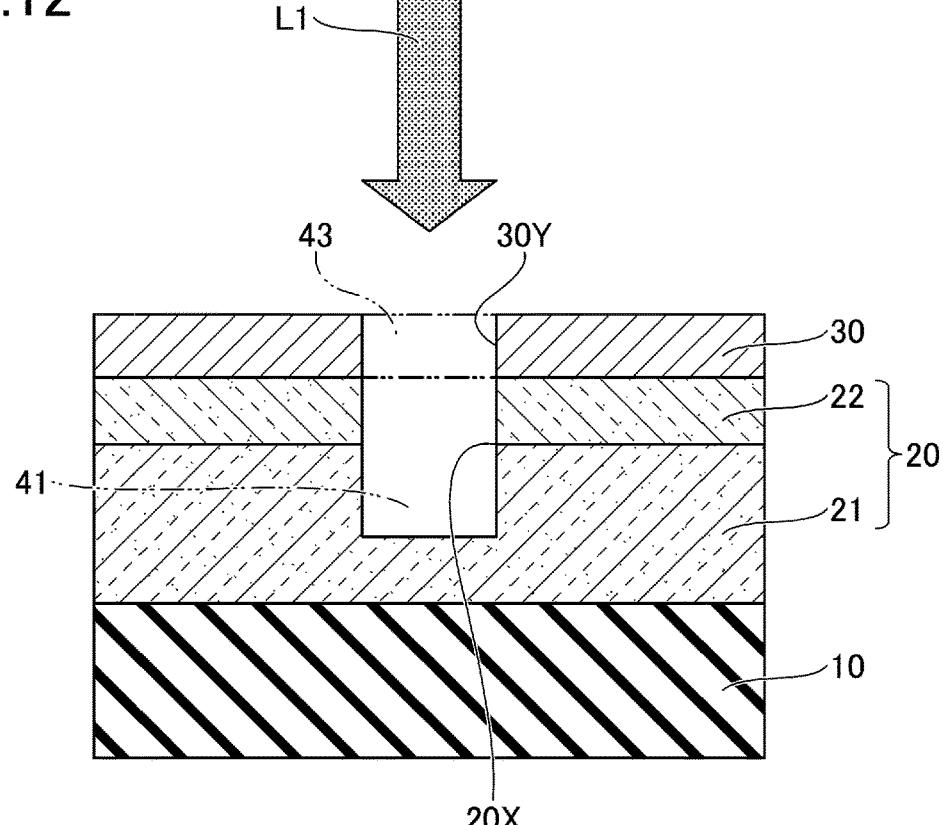
FIG. 12 is a drawing illustrating the method of producing a semiconductor device according to the third embodiment.
Figure 13:
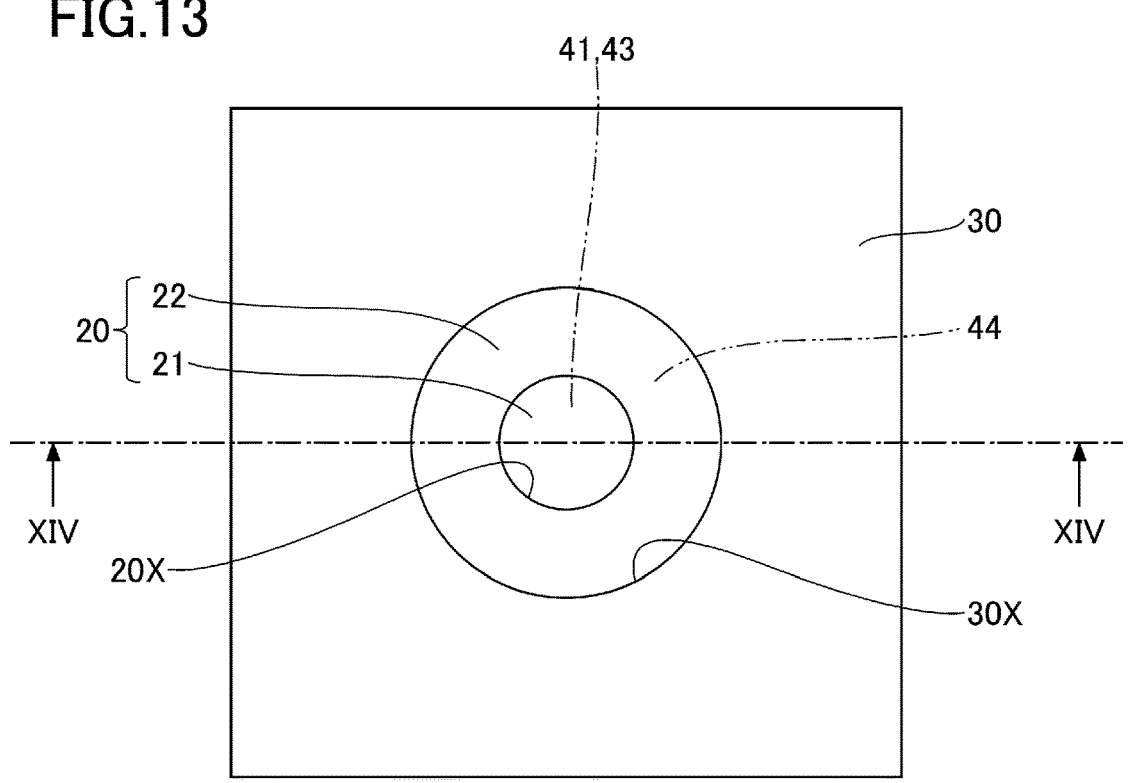
FIG. 13 is a drawing illustrating the method of producing a semiconductor device according to the third embodiment.
Figure 14:
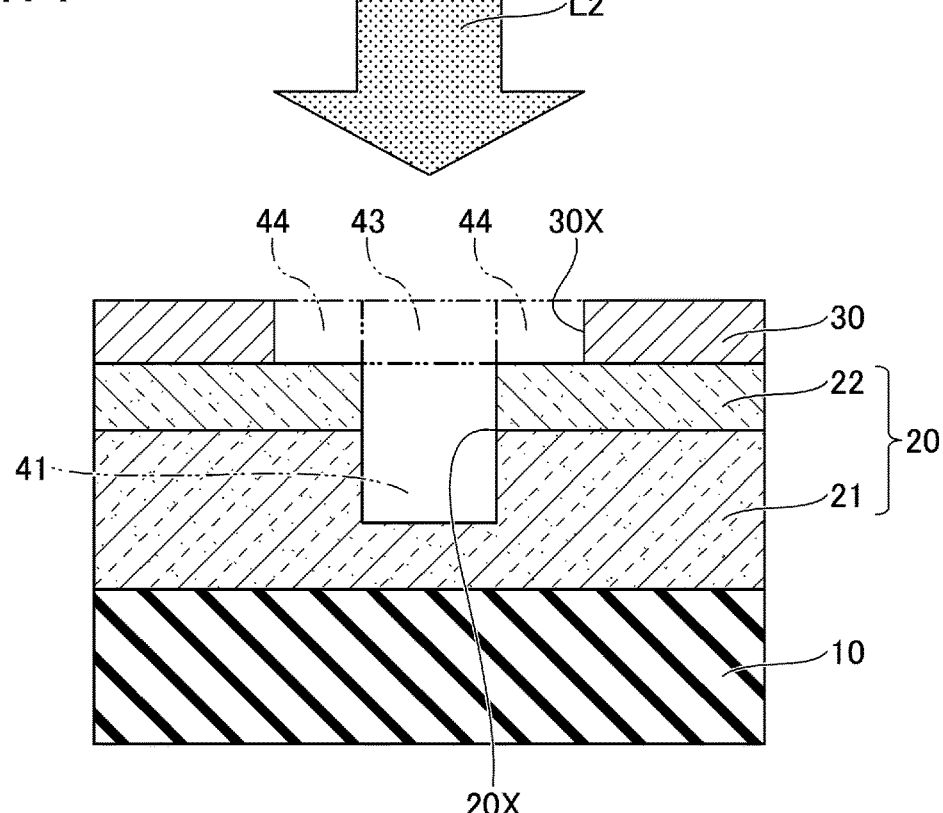
FIG. 14 is a drawing illustrating the method of producing a semiconductor device according to the third embodiment.

A third embodiment will be explained. The third embodiment is different from the first and second embodiments in the timing of irradiation by the first laser and the timing of irradiation by the second laser. FIGS. 11 through 14 are drawings each illustrating a method of producing a semiconductor device according to the third embodiment. FIGS. 11 and 13 are top views, and FIGS. 12 and 14 are cross-sectional views. FIG. 12 corresponds to a cross-sectional view taken along the line XII-XII in FIG. 11. FIG. 14 corresponds to a cross-sectional view taken along the line XIV-XIV in FIG. 13.

In the third embodiment, substantially the same steps as in the first embodiment are performed up to the step of forming the metal film 30 (see FIGS. 1 to 4). Thereafter, as illustrated in FIGS. 11 and 12, irradiation L1 by the first laser that emits ultraviolet light is performed. Unlike irradiation L2 by the second laser emitting red or infrared light, the irradiation L1 with the first laser emitting ultraviolet light is capable of readily processing the semiconductor layer 20 and the metal film 30. As a result, the irradiation L1 with the first laser emitting the ultraviolet light removes a third portion 43 of the metal film 30 having the first diameter D1 and overlapping the first portion 41 in the plan view, and also, removes the first portion 41 of the semiconductor layer 20. With the removal of the first portion 41, the defect 40 included in the first portion 41 is also removed. The removal of the third portion 43 creates a hole 30Y having the first diameter D1 through the metal film 30, and the removal of the first portion 41 creates a hole 20X having the first diameter D1 in the semiconductor layer 20.

As illustrated in FIGS. 13 and 14, an annular fourth portion 44 of the metal film 30 having the second diameter D2 as an outer diameter in the plan view is removed by irradiation L2 with the second laser emitting red or infrared light. A portion obtained by combining the third portion 43 and the fourth portion 44 corresponds to the second portion 42 in the first embodiment and the second embodiment. With the removal of the third portion 43 and the fourth portion 44, a hole 30X having the second diameter D2 is formed through the metal film 30. As a result, the semiconductor layer 20 is exposed through the metal film 30.

An insulating film or the like is subsequently formed on the surface of the semiconductor layer 20 according to need. With this, the semiconductor device is completed in final form.

In the third embodiment also, the second diameter D2 of the hole 30X is larger than the first diameter D1 of the hole 20X. Accordingly, a short-circuit is less likely to occur between the n-side semiconductor layer 21 and the p-side semiconductor layer 22 even if migration of metal contained in the metal film 30 occurs after the formation of the hole 30X. For example, this arrangement reduces the likelihood of the metal migrating to the interface between the n-side semiconductor layer 21 and the p-side semiconductor layer 22 along the inner surface of the hole 20X, which can make it less likely for a short-circuit to occur. Further, forming the hole 30X by the irradiation L2 with the second laser emitting red or infrared light enables the processing of the metal film 30 to form the hole 30X while reducing the occurrence of deterioration of the semiconductor layer 20 caused by the laser light. In this manner, the third embodiment can bring about the same effects as those of the first embodiment.

Figure 15:
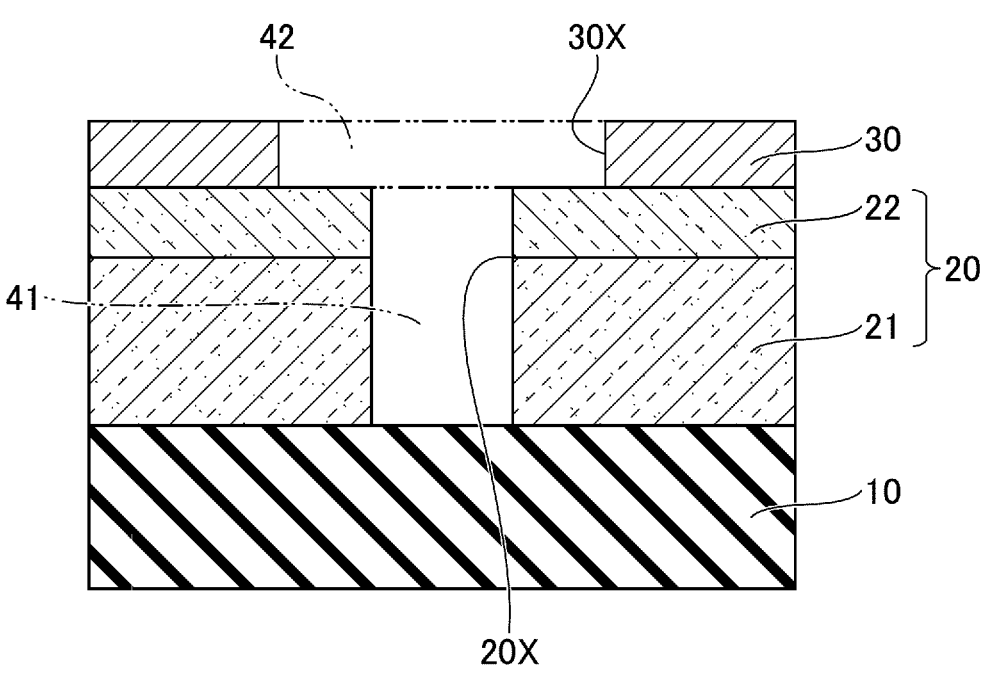
FIG. 15 is a cross-sectional view illustrating a variation of a hole.

In the first through third embodiments, the hole 20X may be formed such as to reach the substrate 10 as illustrated in FIG. 15. That is, the substrate 10 may be exposed by removing a portion of the semiconductor layer 20 under the first portion 41, rather than removing only the first portion 41 as described in aforementioned embodiments.

Although the metal film 30 is not limited to a particular material, Ag or Al may preferably be used. The thickness of the metal film 30 is not limited to a particular dimension. The thickness of the metal film 30 is preferably 0.5 μm or more and 5.0 μm or less, and more preferably 0.5 μm or more and 1.0 μm or less.

The difference between the first diameter D1 and the second diameter D2 is not limited to a particular size. The difference between the first diameter D1 and the second diameter D2 is preferably 1.0 μm or more and 100 μm or less, and more preferably 1.0 μm or more and 20 μm or less.

Fourth Embodiment

A fourth embodiment will be explained. The fourth embodiment relates to a method of producing a light emitting diode, which is an example of the semiconductor device, and is an example of practical application of the first embodiment. FIGS. 16 through 24 are cross-sectional views illustrating the method of producing a semiconductor device according to the fourth embodiment.

Figure 16:
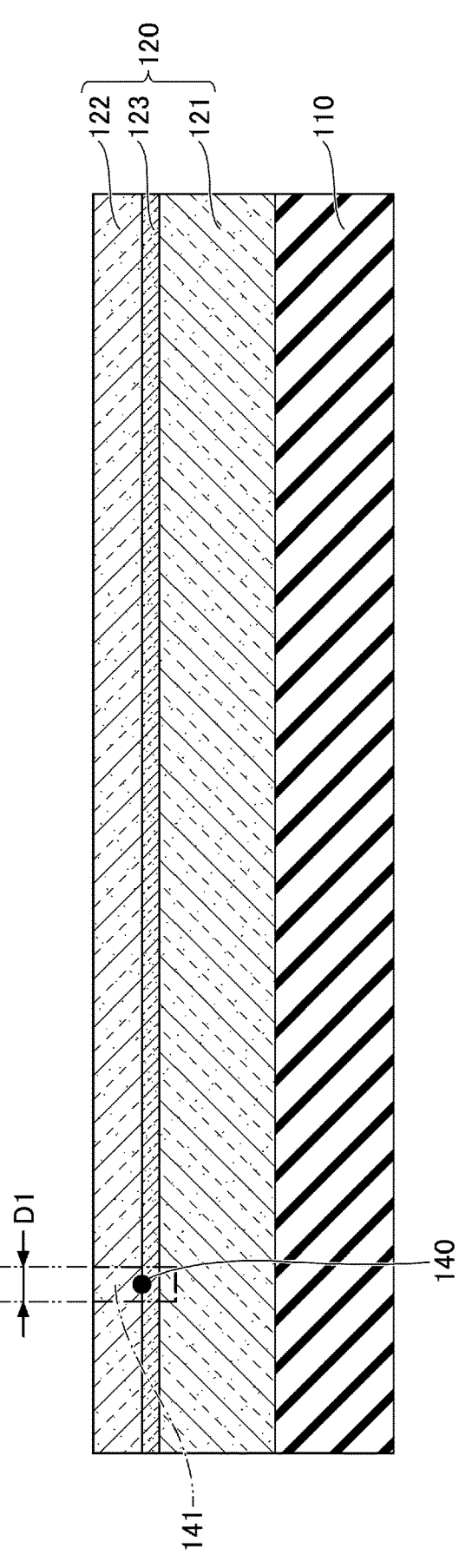
FIG. 16 is a cross-sectional view illustrating a method of producing a semiconductor device according to a fourth embodiment.

In the fourth embodiment, as illustrated in FIG. 16, a step of forming a semiconductor layer 120 on a substrate 110 is performed. The substrate 110 preferably has a light-transmitting property with respect to the peak wavelength of light from the semiconductor layer 120, and may be a sapphire substrate, for example. The step of forming the semiconductor layer 120 includes, for example, a step of forming an n-side semiconductor layer 121 on the substrate 110, a step of forming an active layer 123 on the n-side semiconductor layer 121, and a step of forming a p-side semiconductor layer 122 on the active layer 123. That is, the n-side semiconductor layer 121, the active layer 123, and the p-side semiconductor layer 122 are formed on the substrate 110 in this order from the substrate 110 side. In the step of forming the semiconductor layer 120, a defect 140 may be created inside the semiconductor layer 120. In this embodiment, after the formation of the semiconductor layer 120, the semiconductor layer 120 is inspected to detect the defect 140. The defect 140 occurs, for example, at the interface between the n-side semiconductor layer 121 and the active layer 123, at the interface between the active layer 123 and the p-side semiconductor layer 122, or in the vicinity of these interfaces. The defect 140 may also occur away from these interfaces. The defect 140 to be removed in the present embodiment is not a defect existing on the surface of the semiconductor layer 120 but a defect existing inside the semiconductor layer 120. Examples of the n-side semiconductor layer 121, the active layer 123, and the p-side semiconductor layer 122 include a nitride semiconductor. The n-side semiconductor layer 121 is an n-type semiconductor layer, for example, and the p-side semiconductor layer 122 is a p-type semiconductor layer, for example. The thickness of the semiconductor layer 120 is, for example, 1.0 μm or more and 20 μm or less.

The semiconductor layer 120 includes a first portion 141 including a defect 140. The first portion 141 is a portion to be removed by irradiation L1 with a first laser, which will be described later. The first portion 141 is, for example, a circular region in the plan view, which has a first diameter D1 substantially the same as the beam diameter of the first laser, which will be used later. The first portion 141 has an upper surface that is the same as the surface of the semiconductor layer 120, and has a lower surface closer to the substrate 110 than is the upper surface, with the defect 140 existing between the lower surface and the upper surface. As will be described below, the first laser emits ultraviolet light.

The first diameter D1 is, for example, 0.5 μm or more and 20 μm or less. The distance between the upper surface and the lower surface of the first portion 141 is, for example, 0.5 μm or more and 20 μm or less.

Figure 17:
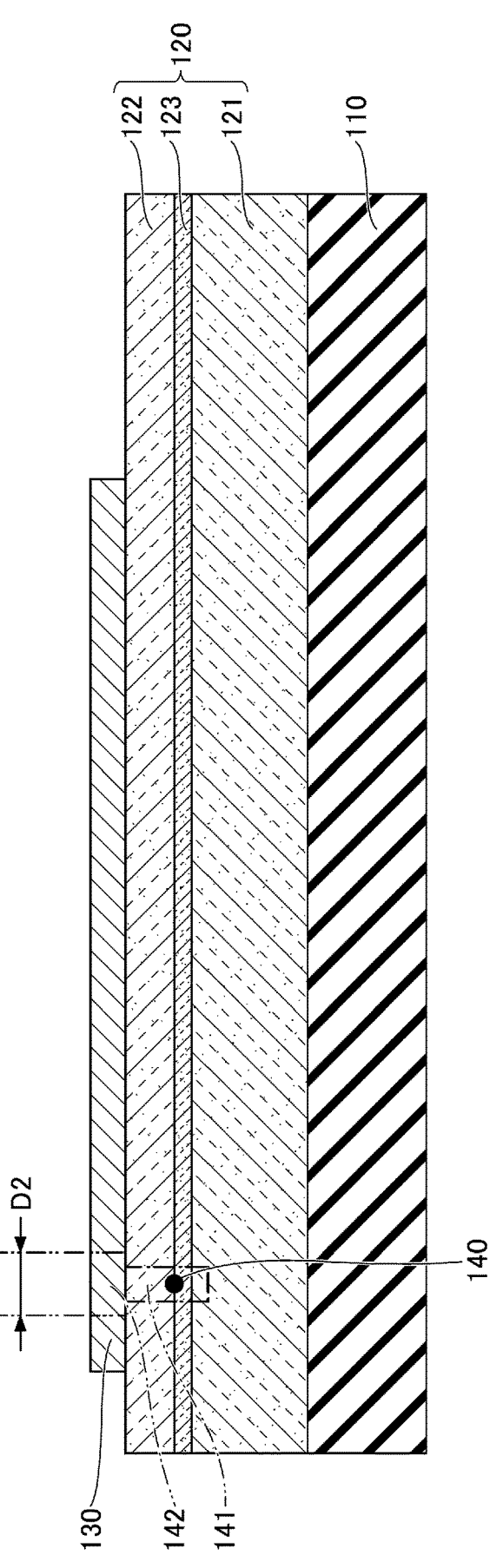
FIG. 17 is a cross-sectional view illustrating the method of producing a semiconductor device according to the fourth embodiment.

As illustrated in FIG. 17, a step of forming a metal film 130 on the semiconductor layer 120 is performed. The metal film 130 preferably has a high reflectance with respect to light emitted from the active layer 123. For example, the metal film 130 preferably has a reflectance of 70% or more, more preferably 80% or more with respect to the peak wavelength of the light from the active layer 123. The material of the metal film 130 includes, for example, at least one selected from the group consisting of silver (Ag), aluminum (Al), lead (Pb), copper (Cu), tin (Sn), zinc (Zn), and gold (Au). The metal film 130 includes a second portion 142 overlapping the first portion 141 in the plan view. The second portion 142 is a portion to be removed by irradiation L2 with a second laser, which will be described later. The thickness of the second portion 142 is equal to the thickness of the metal film 130. The second portion 142 is, for example, a circular region having a second diameter D2 in the plan view. The second diameter D2 is preferably about the same as the beam diameter of the second laser, which will be used later. The second diameter D2 is larger than the first diameter D1. The second portion 142 overlaps the first portion 141 in the plan view. Preferably, the center of the second portion 142 and the center of the first portion 141 are at the same position in the plan view. The second diameter D2 is, for example, 1.5 μm or more and 200 μm or less.

Figure 18:
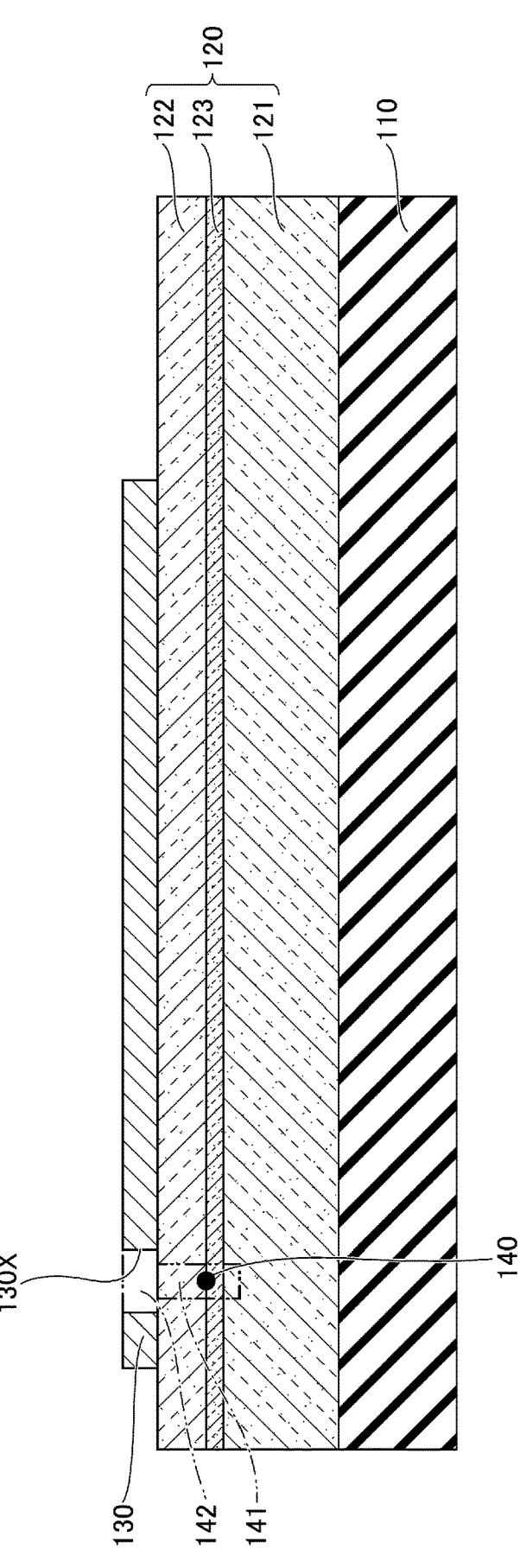
FIG. 18 is a cross-sectional view illustrating the method of producing a semiconductor device according to the fourth embodiment.

As illustrated in FIG. 18, the second portion 142 of the metal film 130 is removed by irradiation L2 with the second laser emitting red or infrared light to expose the semiconductor layer 120 through the metal film 130. The removal of the second portion 142 creates a hole 130X having the second diameter D2 through the metal film 130. The wavelength of the second laser is, for example, 680 nm or more and 1550 nm or less.

Figure 19:
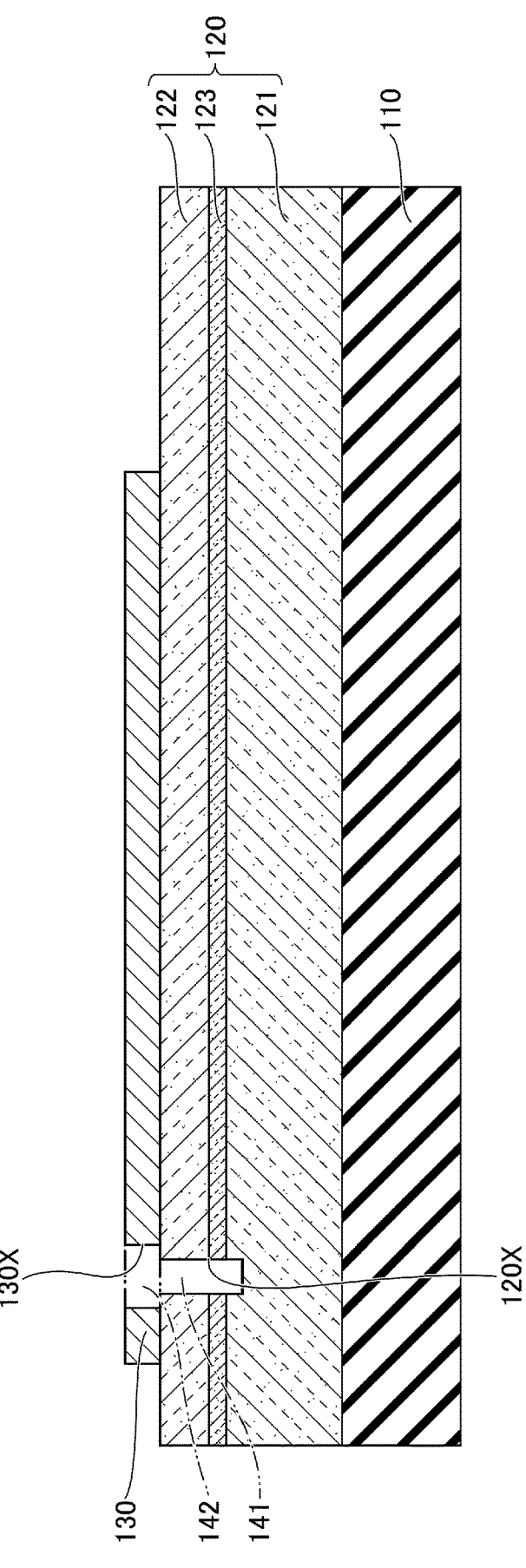
FIG. 19 is a cross-sectional view illustrating the method of producing a semiconductor device according to the fourth embodiment.

As illustrated in FIG. 19, the first portion 141 of the semiconductor layer 120 is removed by irradiation L1 with the first laser emitting ultraviolet light. With the removal of the first portion 141, the defect 140 included in the first portion 141 is also removed. The removal of the first portion 141 creates a hole 120X having the first diameter D1 in the semiconductor layer 120. The wavelength of the first laser is, for example, 190 nm or more and 400 nm or less.

Figure 20:
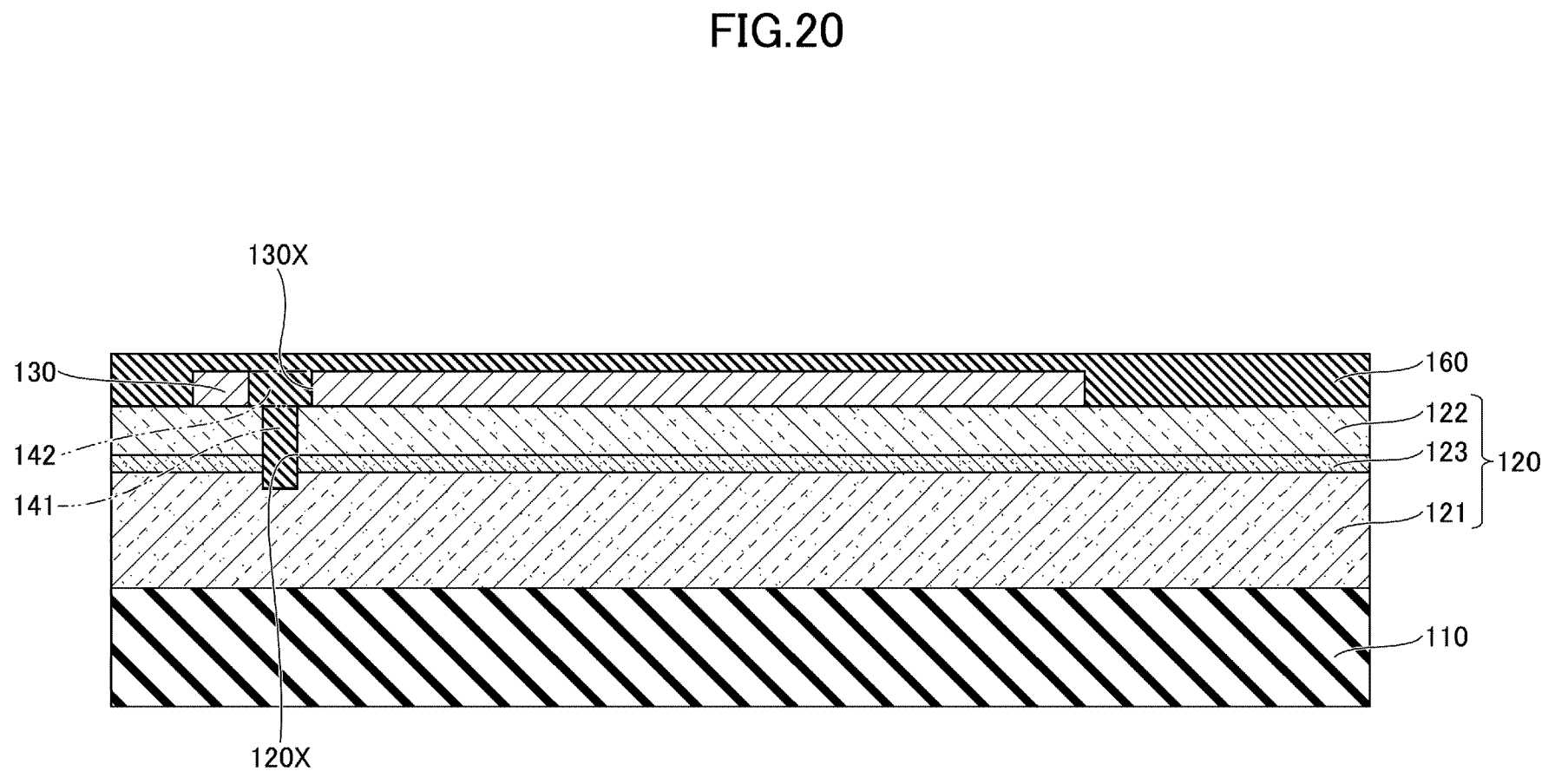

As illustrated in FIG. 20, a first insulating film 160 covering the metal film 130 is formed on the semiconductor layer 120. The first insulating film 160 is, for example, a silicon nitride film. The first insulating film 160 is also formed in the holes 120X and 130X. That is, the first insulating film 160 covers the region where the first portion 141 of the semiconductor layer 120 is removed and the region where the second portion 142 of the metal film 130 is removed. The holes 120X and 130X may be fully filled with the first insulating film 160.

Figure 21:
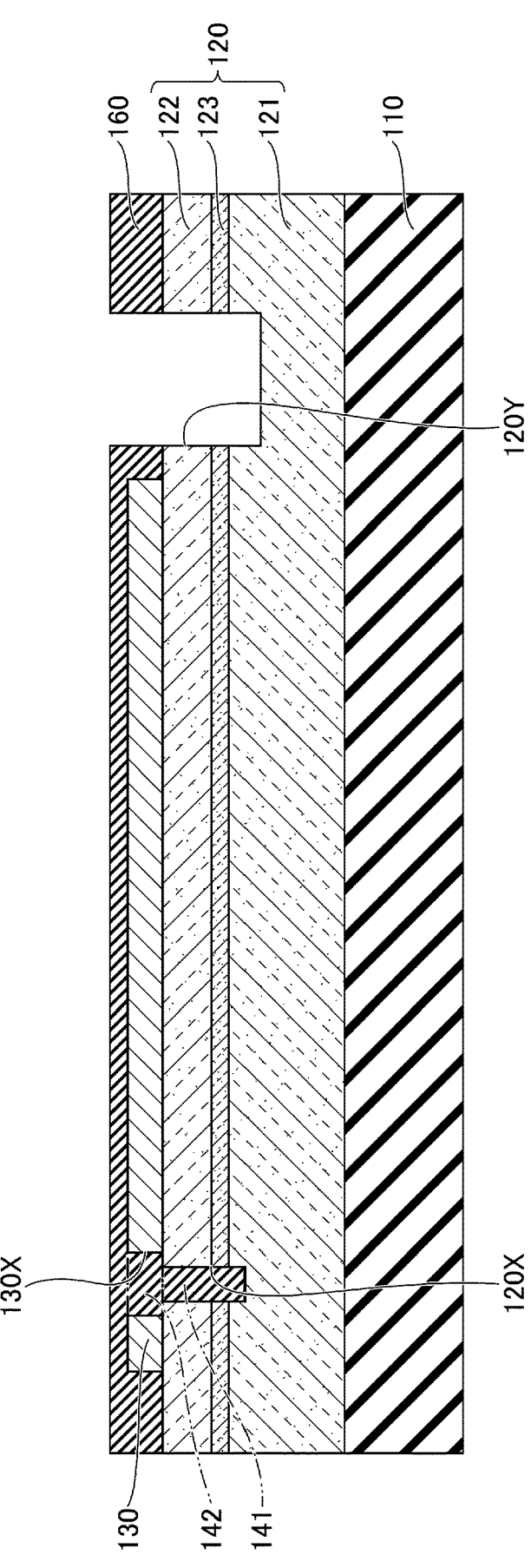
FIG. 21 is a cross-sectional view illustrating the method of producing a semiconductor device according to the fourth embodiment.

As illustrated in FIG. 21, a first hole 120Y from which the n-side semiconductor layer 121 is exposed is formed through the first insulating film 160 and in the semiconductor layer 120 by removing a portion of the first insulating film 160, a portion of the p-side semiconductor layer 122, and a portion of the active layer 123 at the position where no metal film 130 exists. The step of forming the first hole 120Y may also remove a portion of the n-side semiconductor layer 121.

Figure 22:
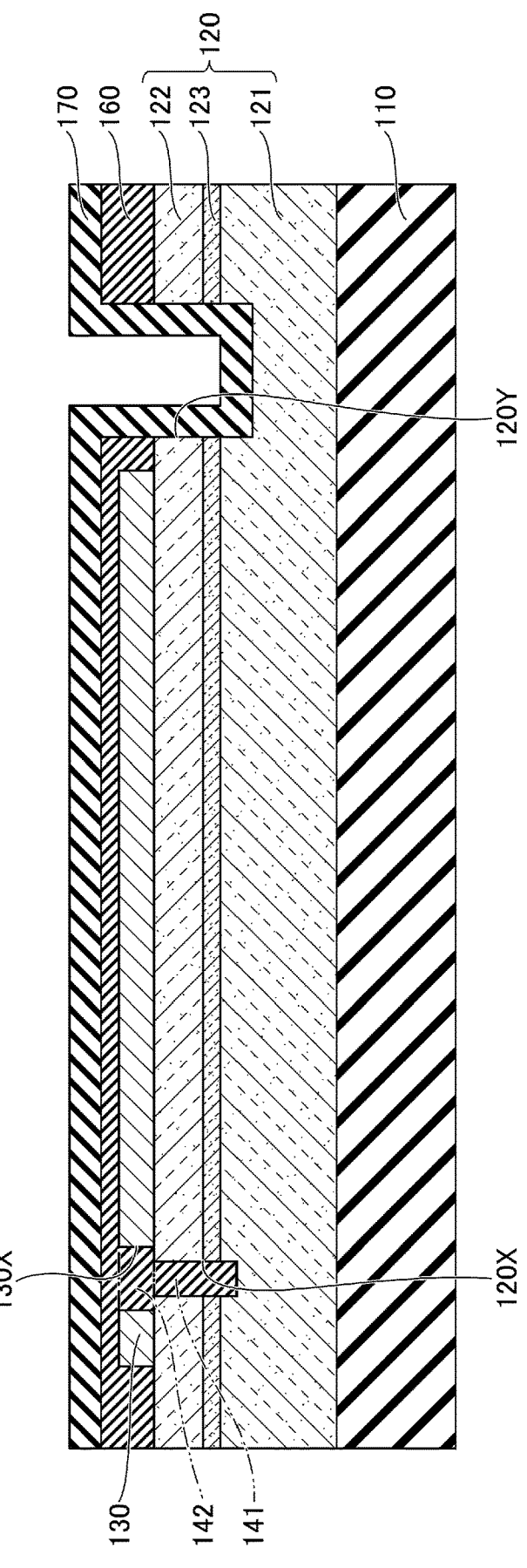
FIG. 22 is a cross-sectional view illustrating the method of producing a semiconductor device according to the fourth embodiment.

As illustrated in FIG. 22, a step of forming a second insulating film 170 on the first insulating film 160 is performed. The second insulating film 170 is also formed in the first hole 120Y such as to cover the bottom surface and the lateral surface of the first hole 120Y. That is, the second insulating film 170 covers the region where the first hole 120Y of the semiconductor layer 120 is formed. The second insulating film 170 is, for example, a silicon oxide film.

Figure 23:
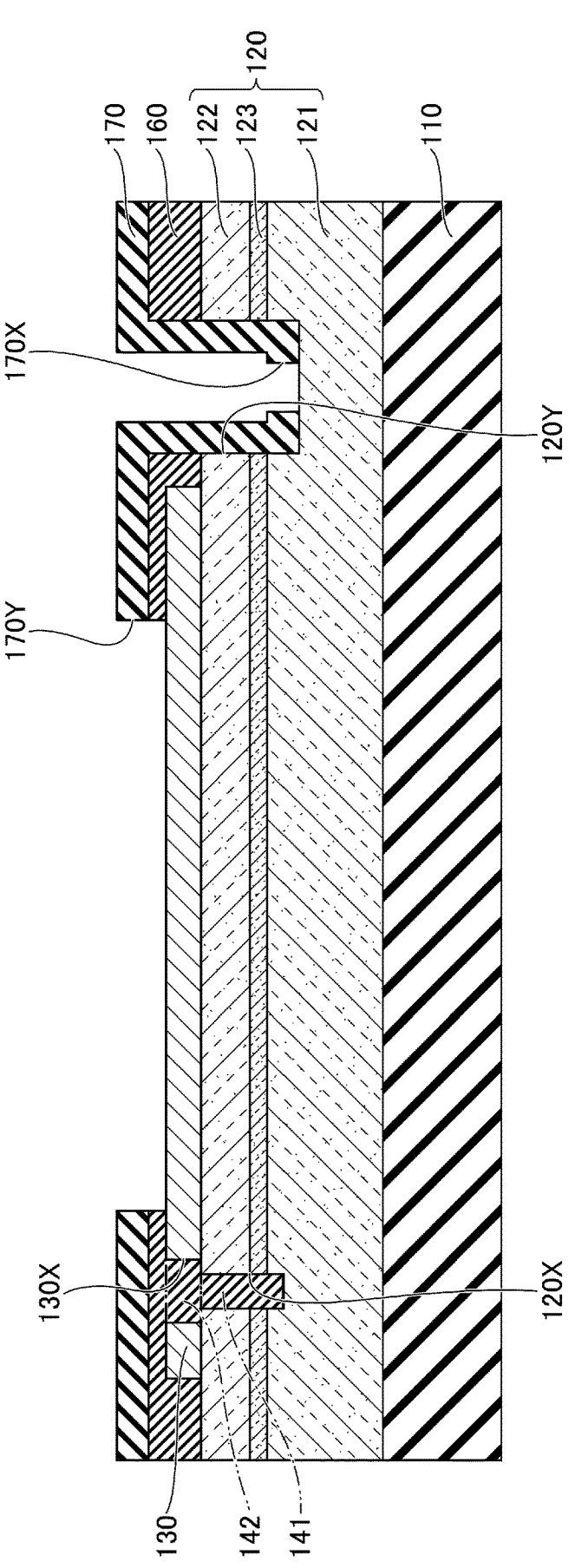
FIG. 23 is a cross-sectional view illustrating the method of producing a semiconductor device according to the fourth embodiment.

As illustrated in FIG. 23, a second hole 170X from which the n-side semiconductor layer 121 is exposed is formed through the second insulating film 170, and a third hole 170Y from which the metal film 130 is exposed is formed through the second insulating film 170 and the first insulating film 160. Such holes can be formed such that the hole 130X formed through the metal film 130 is exposed inside the third hole 170Y.

Figure 24:
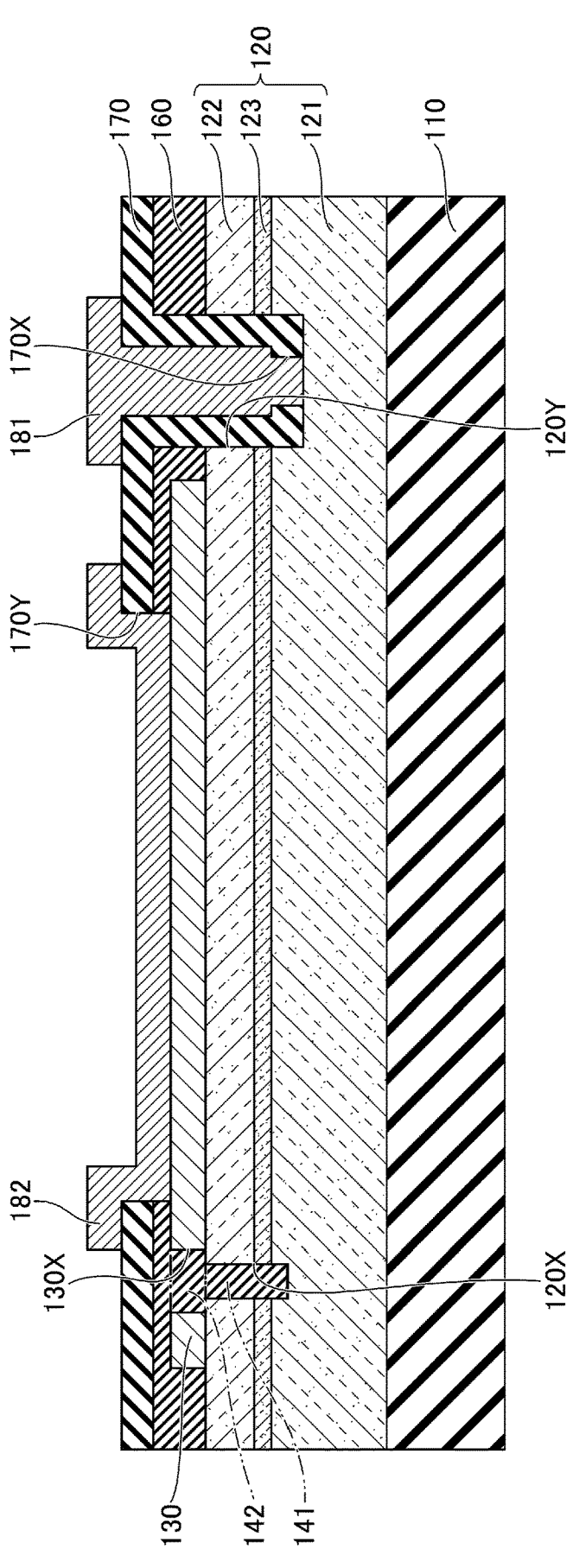
FIG. 24 is a cross-sectional view illustrating the method of producing a semiconductor device according to the fourth embodiment.

As illustrated in FIG. 24, an n-side electrode 181 is formed that is electrically connected to the n-side semiconductor layer 121 through the second hole 170X, and a p-side electrode 182 is formed that is electrically connected to the metal film 130 through the third hole 170Y. The n-side electrode 181 is an example of a conductive portion.

Manufacturing of the light emitting diode as an example of the semiconductor device is properly performed in the manner described above.

In the fourth embodiment, the second diameter D2 of the hole 130X is larger than the first diameter D1 of the hole 120X. Accordingly, a short-circuit is less likely to occur between the n-side semiconductor layer 121 and the p-side semiconductor layer 122 even if migration of metal contained in the metal film 130 occurs after the formation of the hole 130X. For example, the occurrence of the metal migration to the active layer 123 along the inner surface of the hole 120X can be reduced, which can make it less likely for a short-circuit to occur. Further, as noted, the hole 130X is formed by the irradiation L2 with the second laser emitting red or infrared light. By using the second laser that emits red or infrared light, the processing threshold of the metal film 130 becomes smaller than the processing threshold of the semiconductor layer 120. Accordingly, the metal film 130 can be processed to form the hole 130X while reducing the occurrence of deterioration of the semiconductor layer 120 caused by the laser light.

If the defect 140 were included in the semiconductor layer 120 of the light-emitting diode, stress caused by the defect 140 would be transmitted to the surrounding areas of the defect 140. Thus, not only the position of the defect 140 would become a non-light-emitting region, but also the surrounding areas of the defect 140 would possibly include a non-light-emitting region. With the removal of the defect 140, on the other hand, the surrounding areas is not subjected to stress caused by the defect 140. The removal of the defect 140 thus can enable the reduction of a non-light-emitting region in the semiconductor layer 120, compared with when the defect 140 exists.

In the fourth embodiment, the holes 120X and 130X are formed according to the first embodiment, but the holes 120X and 130X may alternatively be formed according to the second embodiment or the third embodiment.

Although preferred embodiments and the like have heretofore been described in detail, these embodiments and the like are non-limiting examples, and various modifications and substitutions may be made to the above-described embodiments and the like without departing from the scope recited in the claims.

The present disclosures non-exhaustively include the subject matter set out in the following clauses:

Clause 1. A method of producing a semiconductor device, comprising:

detecting a defect included in a semiconductor layer;

10 forming a metal film on the semiconductor layer;

removing a first portion of the semiconductor layer by irradiation with a first laser emitting ultraviolet light after the forming of the metal film, the first portion including the defect and having a first diameter in a plan view; and exposing, between the forming of the metal film and the removing of the first portion, the semiconductor layer through the metal film by removing a second portion of the metal film by irradiation with a second laser emitting red or infrared light, the second portion having a second diameter larger than the first diameter in the plan view and overlapping with the first portion in the plan view.

Clause 2. A method of producing a semiconductor device, comprising:

detecting a defect included in a semiconductor layer;

forming a metal film on the semiconductor layer; and removing, after the forming of the metal film, both a first portion of the semiconductor layer by irradiation with a first laser emitting ultraviolet light and a second portion of the metal film by irradiation with a second laser emitting red or infrared light, wherein the first portion includes the defect and has a first diameter in a plan view, the second portion has a second diameter larger than the first diameter in the plan view and overlaps with the first portion in the plan view, and by the removing of the second portion, the semiconductor layer is exposed through the metal film.

Clause 3. A method of producing a semiconductor device, comprising:

detecting a defect included in a semiconductor layer;

forming a metal film on the semiconductor layer; and removing a first portion of the semiconductor layer by irradiation with a first laser emitting ultraviolet light after the forming of the metal film, the first portion including the defect and having a first diameter in a plan view, wherein by the irradiation with the first laser, a third portion of the metal film is removed, the third portion having the first diameter and overlapping the first portion in the plan view, and removing, after the removing of the first portion, an annular fourth portion of the metal film by irradiation with a second laser emitting red or infrared light, the annular forth portion having a second diameter as an outer diameter, the second diameter being larger than the first diameter in the plan view.

Clause 4. The method of producing a semiconductor device as recited in any one of clauses 1 to 3, wherein a wavelength of the ultraviolet light is 190 nm or more and 400 nm or less, and a wavelength of the red or infrared light is 680 nm or more and 1550 nm or less.

Clause 5. The method of producing a semiconductor device as recited in any one of clauses 1 to 4, wherein a material of the metal film includes at least one selected from a group consisting of silver, aluminum, lead, copper, tin, zinc, and gold.

Clause 6. The method of producing a semiconductor device as recited in any one of clauses 1 to 5, further comprising:

forming the semiconductor layer on a substrate before the detecting of the defect, the forming of the semiconductor layer including forming an n-side semiconductor layer, an active layer, and a p-side semiconductor layer on the substrate in this order from the substrate;

forming, after the removing of the first portion, a first insulating film on the semiconductor layer, the first insulating film covering a region where the first portion has been removed; and forming, through the first insulating film and in the semiconductor layer, a first hole that exposes the n-side semiconductor layer by removing a portion of the first insulating film, a portion of the p-side semiconductor layer, and a portion of the active layer.

Clause 7. The method of producing a semiconductor device as recited in clause 6, further comprising:

forming, after the forming of the first hole, a second insulating film over the first insulating film and in the first hole;

forming a second hole through the second insulating film in the first hole to expose the n-side semiconductor layer; and forming a conductive portion electrically connected to the n-side semiconductor layer through the second hole.

Clause 8. The method of producing a semiconductor device as recited in any one of clauses 1 to 7, wherein a difference between the first diameter and the second diameter is 1.0 μm or more and 100 μm or less.

Clause 9. The method of producing a semiconductor device as recited in any one of clauses 1 to 8, wherein a thickness of the metal film is 0.5 μm or more and 5.0 μm or less.

What is claimed is:

1. A method of producing a semiconductor device, the method comprising steps of:

detecting a defect included in a semiconductor layer;

forming a metal film on the semiconductor layer;

after the step of forming the metal film on the semiconductor layer, exposing the semiconductor layer through the metal film by removing a portion of the metal film by irradiation with a first laser emitting red or infrared light; and after the step of exposing the semiconductor layer, removing a portion of the semiconductor layer by irradiation with a second laser emitting ultraviolet light, said portion of the semiconductor layer including the defect, wherein:

a diameter of said portion of the metal film is greater than a diameter of said portion of the semiconductor layer in a plan view, and said portion of the metal film overlaps with said portion of the semiconductor layer in the plan view.

2. The method of producing a semiconductor device as claimed in claim 1, wherein a wavelength of the ultraviolet light is 190 nm or more and 400 nm or less, and a wavelength of the red or infrared light is 680 nm or more and 1550 nm or less.

3. The method of producing a semiconductor device as claimed in claim 1, wherein a material of the metal film comprises at least one of silver, aluminum, lead, copper, tin, zinc, or gold.

4. The method of producing a semiconductor device as claimed in claim 1, further comprising steps of:

before the step of detecting the defect, forming the semiconductor layer on a substrate, the step of forming the semiconductor layer comprising forming an n-side semiconductor layer, an active layer, and a p-side semiconductor layer on the substrate in this order from the substrate;

after the step of removing said portion of the semiconductor layer, forming a first insulating film on the semiconductor layer, the first insulating film covering a region where said portion of the semiconductor layer has been removed; and forming, through the first insulating film and in the semiconductor layer, a first hole to expose the n-side semiconductor layer by removing a portion of the first insulating film, a portion of the p-side semiconductor layer, and a portion of the active layer.

5. The method of producing a semiconductor device as claimed in claim 4, further comprising steps of:

after the step of forming the first hole, forming a second insulating film over the first insulating film and in the first hole;

forming a second hole through the second insulating film in the first hole to expose the n-side semiconductor layer; and forming a conductive portion electrically connected to the n-side semiconductor layer through the second hole.

6. The method of producing a semiconductor device as claimed in claim 1, wherein a difference between the diameter of said portion of the semiconductor layer and the diameter of said portion of the metal film is 1.0 μm or more and 100 μm or less.

7. The method of producing a semiconductor device as claimed in claim 1, wherein a thickness of the metal film is 0.5 μm or more and 5.0 μm or less.

* * * * *